(12) United States Patent
Lao et al.

(10) Patent No.: US 7,973,568 B2
(45) Date of Patent: Jul. 5, 2011

(54) SYSTEM FOR PROVIDING LARGE RC TIME CONSTANTS IN INTEGRATED CIRCUITS

(76) Inventors: Zhihao Lao, Camarillo, CA (US); Ilchong Zon, Westlake Village, CA (US)

( * ) Notice: Subject to any disclaimer, the term of this patent is extended or adjusted under 35 U.S.C. 154(b) by 0 days.

(21) Appl. No.: 12/552,535

(22) Filed: Sep. 2, 2009

(65) Prior Publication Data
US 2010/0052734 A1    Mar. 4, 2010

Related U.S. Application Data

(60) Provisional application No. 61/190,674, filed on Sep. 2, 2008.

(51) Int. Cl.
*H03K 5/00* (2006.01)
*H03K 5/22* (2006.01)
(52) U.S. Cl. .......................... 327/58; 327/558
(58) Field of Classification Search .............. 327/50, 327/58, 61–62, 551–559, 336–337
See application file for complete search history.

(56) References Cited

U.S. PATENT DOCUMENTS

| | | | | |
|---|---|---|---|---|
| 4,490,653 A | * | 12/1984 | Olmstead | 315/403 |
| 4,829,265 A | * | 5/1989 | Susak | 330/253 |
| 6,590,439 B1 | * | 7/2003 | Larson | 327/363 |
| 7,102,865 B2 | * | 9/2006 | Lu et al. | 361/56 |

FOREIGN PATENT DOCUMENTS

| | | | | |
|---|---|---|---|---|
| JP | 355000642 A | * | 1/1980 | |
| JP | 62075936 A | * | 4/1987 | |

* cited by examiner

*Primary Examiner* — Dinh T. Le
(74) *Attorney, Agent, or Firm* — GSS Law Group

(57) ABSTRACT

A peak detector for implementation in a monolithic integrated circuit includes one or more Miller capacitors and one or more transistors for selectively setting large RC time constant values only with components included in the integrated circuit's die. Neither resistors nor capacitors located outside the integrated circuit are used for setting a selected value of a time constant. Some embodiments of the invention include diodes for compensation of amplifier leakage current in the peak detector, thereby increasing a maximum value of a time constant that can be implemented in an integrated circuit. A peak detector in accord with an embodiment of the invention may optionally be configured for either single-ended or differential operation.

12 Claims, 7 Drawing Sheets

SYSTEM FOR PROVIDING LARGE RC TIME CONSTANTS IN INTEGRATED CIRCUITS

CROSS REFERENCE TO RELATED APPLICATIONS

This application claims the benefit of U.S. Provisional Application No. 61/190,674 filed Sep. 2, 2008, incorporated herein by reference in its entirety.

FIELD OF THE INVENTION

Embodiments of the invention relate to a system for selectively implementing an RC time constant having a relatively large value in an integrated circuit.

BACKGROUND

A time constant is a parameter used to characterize the response of a system to a change in an input condition. The value of a time constant used to characterize electronic systems is calculated by multiplying a value of resistance R in the system times a value of capacitance C in the system and is referred to as an RC time constant. Methods for calculating and measuring responses by electronic systems to different input signals and RC time constants are well known.

For some applications, a preferred response by an electronic system corresponds to a large value for an RC time constant. For example, a control circuit having a large RC time constant will have a response related to low-frequency components of an input signal while suppressing responses to high-frequency components of the input signal. A response related to a large RC time constant may be advantageous, for example, in a control circuit for maintaining a direct current (DC) voltage within selected limits in the presence of high-frequency noise.

In a system having space for discrete electronic components, an RC time constant having a large value may be implemented by selecting resistors and capacitors with sufficiently large values to form the desired mathematical product. For discrete resistors in particular, the package size and cost of a resistor with a large resistance value is about the same as the package size and cost of a resistor with a small resistance value. However, in an integrated circuit, implementing a large value for an RC time constant may not be so easily accomplished. The amount of die area required for forming a resistor or a capacitor in an integrated circuit increases as the value of resistance or capacitance increases. As a result, implementing large time constant values with structures formed in an integrated circuit by methods known in the art may consume so much die area as to be impractical or uneconomical. Although techniques for increasing an effective amount of resistance or capacitance in an integrated circuit are known in the art, the resulting values of resistance and capacitance may still be too small to achieve a desired large time constant value in an integrated circuit. Furthermore, techniques known in the art for implementing a large time constant by increasing an effective amount of resistance may result in substantial variation in time constant values because of variations in manufacturing process variables and variations in an integrated circuit's operating temperature.

Implementing a large RC time constant in an integrated circuit manufactured by bipolar semiconductor processes illustrates some of the difficulties encountered with solutions known in the art. For example, a time constant of 0.1 millisecond (ms), a large RC time constant by conventional practices for integrated circuit design but small compared to time constants related to many physical processes, could be implemented with a 1 megohm (MΩ) resistor and a 100 picoFarad (pF) capacitor. Forming a 1 MΩ resistor as a metal sheet resistor in a typical bipolar process having a density of 50Ω per square and a minimum line width of 2 micrometers (μm) would require a serpentine line 2 μm wide by 40,000 μm, that is, 40 millimeters long. Such a large structure would be very expensive in terms die area and integrated circuit package size. A 100 pF capacitor implemented in a metal-insulator-metal (MIM) structure such as in a pure bipolar process would also require a large area on the integrated circuit's die. As a result, integrated circuits which include circuit functions requiring large time constants often find it necessary to use one or more discrete capacitors or resistors located externally to and electrically connected to the integrated circuit to set the value of the time constant.

Combining discrete external components with internal components in an integrated circuit to implement a time constant with a large value has several disadvantages. Manufacturing and inventory costs are higher for a combination of an integrated circuit and discrete components than for an integrated circuit alone. Reliability of a system with a combination of an integrated circuit and discrete external resistors and capacitors may be lower than reliability of an integrated circuit without such external components. The number of connection pins on the integrated circuit package may need to be increased to permit electrical connections to external resistors or capacitors, and a larger package may be needed to provide space for the higher pin count. Also, a system having a combination of an integrated circuit and discrete components may be more susceptible to electrical noise and interference than a system operating without such discrete components.

What is needed is a system for implementing large time constants only with components included in an integrated circuit, that is, without external resistors or capacitors. What is also needed is a system for implementing large time constants while reducing sensitivity to changes in process variables related to manufacture of an integrated circuit and changes in an integrated circuit's operating temperature. What is further needed is a system for implementing large time constants that does not require a large amount of die area in an integrated circuit.

SUMMARY

A system for implementation in an integrated circuit is configurable for a selected value of RC time constant. An embodiment of the invention is capable of implementing a relatively large value of an RC time constant in an area of an integrated circuit's die that is substantially smaller than circuits known in the art. An integrated circuit comprising an embodiment of the invention includes on its die all of the components needed to set a relatively large value of RC time constant, thereby eliminating the need for external resistors and capacitors used for setting a value for an RC time constant by many circuits known in the art.

Embodiments of the invention comprise a peak detector having a transistor and a relatively small-valued capacitor connected in an electrical circuit included in an integrated circuit. The transistor and capacitor in the peak detector cooperate to provide a selected value of a time constant. The integrated circuit die area used to fabricate the peak detector is smaller than for circuits known in the art that do not use external components for setting a relatively large value of an RC time constant. The larger the value of a selected time constant, the greater the difference in die area for implementing the time constant between an embodiment of the invention and circuits known in the art. In other words, the larger the value of an RC time constant, the greater the benefit provided by embodiments of the invention compared to circuits known in the art.

Some embodiments of the invention include a combination of a peak detector and a negative-feedback amplifier configured to increase an effective amount of capacitance by the Miller effect. An embodiment of the invention having a Miller effect capacitor optionally includes one or more diodes to reduce amplifier leakage currents and also to reduce the effects of process and temperature variations. Some embodiments of the invention are configured for single-ended signals and others are configured for differential signals.

This section summarizes some features of the present invention. These and other features, aspects, and advantages of the embodiments of the invention will become better understood with regard to the following description and upon reference to the following drawings, wherein:

DESCRIPTION

Figure 1:
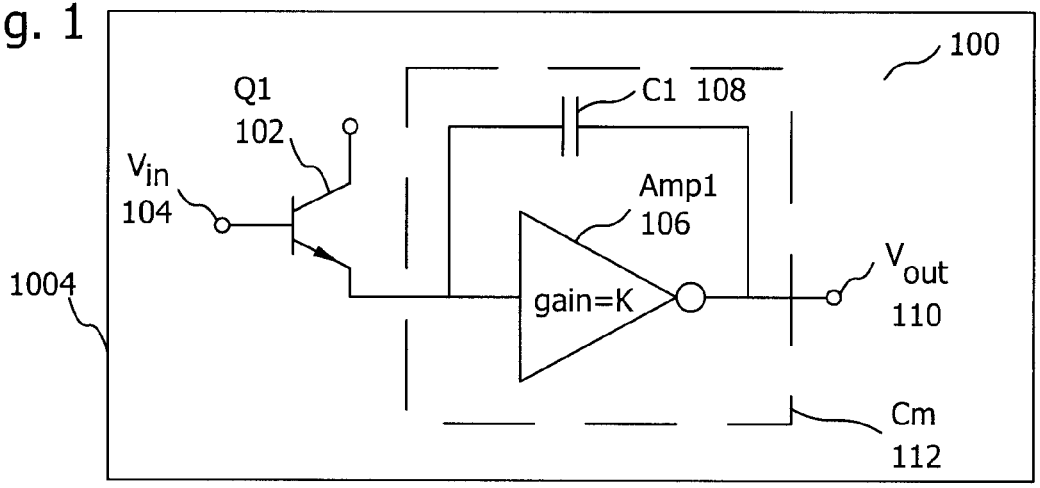
FIG. 1 is a schematic diagram of an example of a peak detector for providing large RC time constants in integrated circuits.

A system for providing large RC time constants in integrated circuits comprises a peak detector for setting the value of an RC time constant without the use of external resistors or capacitors. The peak detector optionally comprises a Miller capacitor for increasing the magnitude of an RC time constant in a system built within an integrated circuit. A peak detector in accord with an embodiment of the invention may optionally be adapted for operation in single-ended or differential circuits.

Embodiments of the invention provide several advantages over circuits known in the art. An integrated circuit which includes a peak detector in accord with an embodiment of the invention does not require external capacitors or resistors to set a large value for a time constant. An embodiment of the invention requires less die area to implement a large RC time constant than circuits known in the art. Alternatively, for a given amount of die area in an integrated circuit, an embodiment of the invention is configurable for a substantially larger time constant than circuits known in the art. Being wholly contained within an integrated circuit, embodiments of the invention are less susceptible to electrical noise and interference than circuits known in the art which use external resistors or capacitors for setting the value of an RC time constant. Additionally, a calculated value of reliability for an embodiment of the invention, for example a value for "mean time between failure", will be higher than a value calculated for a prior art system comprising a combination of an integrated circuit and discrete external resistors and capacitors. Also, embodiments of the invention have less variation in time constant values resulting from changes in temperature or changes in manufacturing process variables than circuits known in the art.

As used herein, the expression "peak detector" is synonymous with "system for providing large RC time constants in integrated circuits". A time constant refers to a parameter which may be used to predict a response of a system to a time-varying input to the system. An RC time constant is a property of a system comprising an electrical circuit. The value of an RC time constant is determined by a selected value of electrical resistance in the electrical circuit multiplied by a selected value of electrical capacitance in the electrical circuit. As used herein, a large time constant is one having a value that would, if implemented in any of several circuit configurations widely known in the art, use a combination of components in an integrated circuit and components external to the integrated circuit. One skilled in the art will appreciate that methods for predicting the time-domain and frequency-domain responses of a system to a time-varying input for different values of RC time constant are well known and will not be described further herein. An integrated circuit as used herein refers to a monolithic integrated circuit, that is, a miniaturized electronic circuit constructed in a single die made of silicon or other semiconductor material and optionally comprising protective packaging.

FIG. 1 illustrates a schematic diagram of an example of a peak detector 100 in accord with an embodiment of the invention. The peak detector 100 of FIG. 1 may be used to implement a relatively large value of a time constant, with all of the components shown in FIG. 1 having values and physical sizes convenient for being included in a an integrated circuit produced by conventional manufacturing processes, for example a bipolar semiconductor manufacturing process. In the example of FIG. 1, an input terminal Vin 104 is connected to the base of an NPN transistor Q1 102. Input terminals and output terminals shown in figures herein are representative of electrical connections made within an integrated circuit, but may optionally be connected to one or more pins on an integrated circuit's package. Also, unless otherwise indicated, "connected" as used herein refers to an electrical connection.

Continuing with FIG. 1, the collector of transistor Q1 102 is connected to a suitable power supply. The emitter of transistor Q1 102 is connected to an input of an amplifier Amp1 106. A feedback loop capacitor C1 108 is connected in a negative feedback loop from an output of amplifier Amp1 106 to the input connected to emitter of transistor Q1 102. A combination of an amplifier and a capacitor as shown in FIG. 1 and elsewhere is referred to herein as a Miller capacitor. The effective capacitance of a Miller capacitor is approximately equal to a constant K times the value of capacitance of capacitor C1 108, where K is the gain of the amplifier Amp1 106. A Miller capacitor Cm 112 is shown by a dashed line boundary in FIG. 1.

A solid boundary 1004 drawn around the peak detector 100 of FIG. 1 represents an integrated circuit that includes all of the components in the embodiment of the invention 100. An of the embodiment of the invention, for example the peak detector in FIG. 1, is contained entirely in one integrated circuit, that is, the peak detector is fabricated entirely on one die of an integrated circuit using any integrated circuit manufacturing process. Embodiments of the invention 100 do not require external capacitors, external resistors, or external circuits whose function is to provide an effective value of capacitance or resistance, to set a selected value of a time constant.

The effective capacitance Ce of the peak detector of FIG. 1 is much larger than the actual value of the capacitor C1 108, since amplifiers may be designed to have relatively large values of gain K. The effective resistance Re of the peak detector 100 varies between values related to the on-resistance Ron and the off-resistance of the transistor Q1 102. The mathematical product of effective resistance Re=26 mV/Ie, where Ie is the magnitude of the emitter current corresponding to leakage current for the amplifier Amp1 106, and effective capacitance Ce=K×C1 is equal to the value of the time constant for the peak detector.

Figure 2:
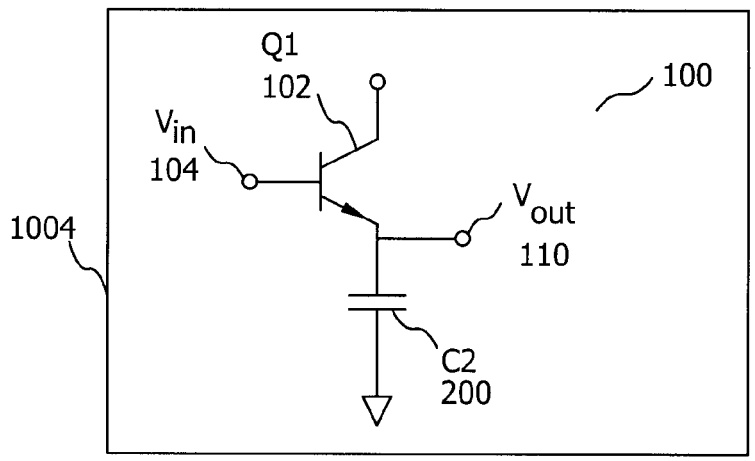
FIG. 2 is a schematic of a peak detector in accord with an embodiment of the invention.

The example of a peak detector 100 in FIG. 2 may be used to illustrate operation of embodiments of the invention. A solid boundary 1004 is representative of an integrated circuit that includes all the components of the peak detector 100. The Miller capacitor Cm 112 of FIG. 1 is replaced in FIG. 2 with a bypass capacitor C2 200. By suitable choice of values for C1, C2, and K, the responses of the peak detectors of FIG. 1 and FIG. 2 can be made approximately the same, although the example of FIG. 2 would be difficult to implement in an integrated circuit in the case where a desired time constant has a large value, for reasons previously explained. When a step voltage is applied to the input terminal Vin 104 of the peak detector 100, the voltage on the output terminal Vout 110 will exhibit a nonlinear response. First, the output voltage on Vout 110 increases quickly, with a rise time determined by C2 200 and equivalent resistance Re=Ron, the on-resistance of the transistor Q1 102. As the output voltage approaches its ultimate value, the equivalent resistance changes more slowly, eventually becoming equal to the off-resistance Roff of the transistor Q1 102. The time constant of the peak detector 100 after the output from the peak detector 100 closely approaches its ultimate value is C2×Roff. Since Roff is a relatively large number, a relatively large value of time constant may be implemented with a small value, and small physical size, of capacitor C2 200.

Figure 3:
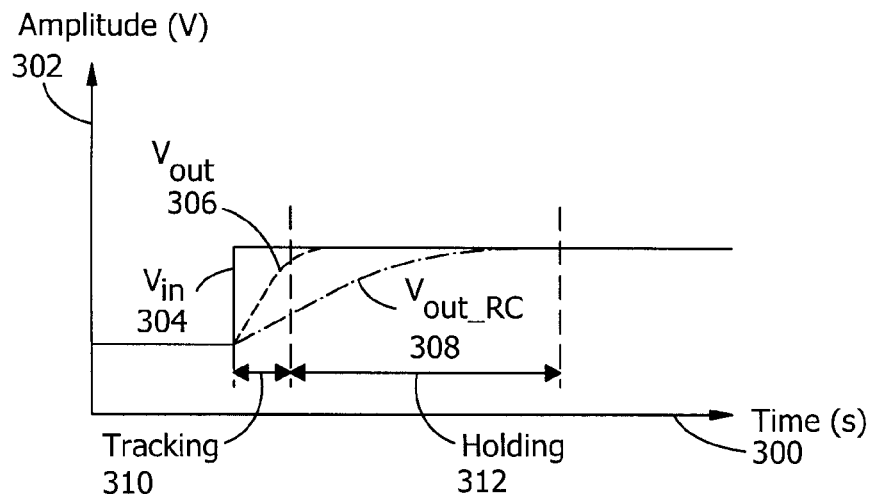
FIG. 3 is a graph of output from the peak detector of FIG. 2 in response to a step input signal.

Changes in input and output voltages for the example of FIG. 2 are shown in FIG. 3. In FIG. 3, the horizontal axis 300 represents time in seconds (s) and the vertical axis represents amplitude in volts (V). Solid line Vin 304 represents a step input waveform applied to Vin 104 on the peak detector 100 of FIG. 2. Dashed line Vout 306 represents output from the peak detector 100 on Vout 110. The output response of the peak detector 100 (line Vout 306) may be divided into two time intervals. The first interval, labeled Tracking 310 in FIG. 3, represents the time during which the rate of change in output voltage is constrained by C2 200 and Re=Ron of the transistor Q1 102. The second time interval, labeled Holding 312, represents the time during which the output of the peak detector 100 approaches its ultimate value and the time constant approaches the value determined by the product of Re=Roff and C2. For comparison purposes, a dot-dash line labeled Vout_RC 308 represents the exponential increase in output voltage from a conventional first order low pass filter having step waveform Vin 304 as input. As shown in FIG. 3, a peak detector in accord with an embodiment of the invention reaches its ultimate output value more quickly than a simple first-order system when both have the same values of effective resistance and effective capacitance.

Figure 4:
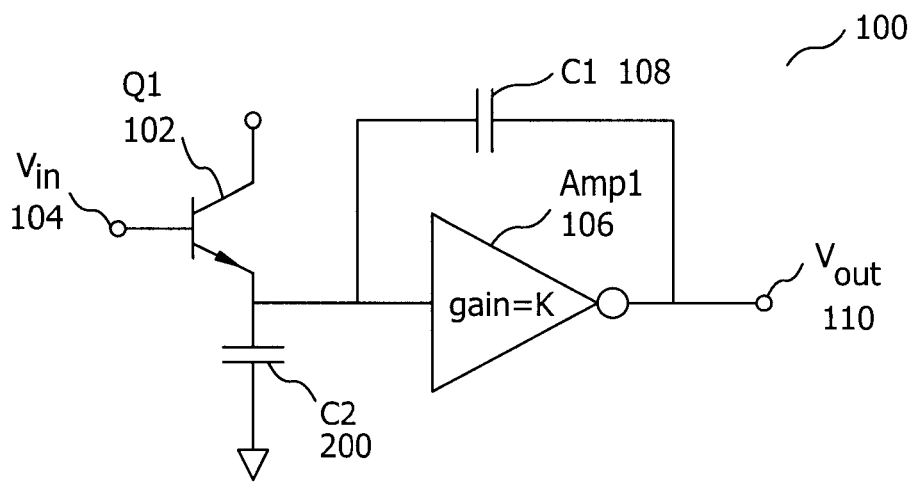
FIG. 4 is a schematic of an alternative embodiment of the invention having higher equivalent capacitance, and therefore a larger maximum value of an RC time constant, than the examples of FIG. 1 or FIG. 2.

A peak detector having a larger equivalent value of capacitance, and therefore a larger maximum value for a time constant, than either of the examples of FIG. 1 or FIG. 2 is shown in FIG. 4. In FIG. 4, the resistor C2 200 of FIG. 2 interacts with the Miller capacitor, resulting in a total effective capacitance Ce having a value of C2+(K×C1). As with previous examples, components in the example of FIG. 4 have small enough values and small enough physical sizes for inclusion in an integrated circuit, without the need for external resistors or capacitors to set a relatively large value for a time constant.

The embodiment of the invention in FIG. 4 may be used to illustrate how substantial savings in integrated circuit die area may be realized, compared to circuits known in the art. For the peak detector 100 of FIG. 4 to implement a 3 dB bandwidth of 16 kiloHertz (kHz), capacitor C2 200 could have a value of 1 pF and capacitor C1 108 could have a value of 3.8 pf when used in combination with an amplifier Amp1 106 having a gain of 100 and an input leakage current of 10 microamperes. When produced in a three-metal MIM process, capacitors C1 108 and C2 200 occupy a combined area on an integrated circuit die of 310 micrometers (μm) by 50 μm. In contrast, a first-order RC low pass filter known in the art and having the same 16 kHz 3 dB bandwidth could be made with a 100 kilohm (kΩ) resistor and a 100 pF capacitor. A 100 kΩ resistor made by a thin film process would require a die area of 3 μm by 6 millimeters (mm) and a 100 pF capacitor implemented in a three-metal MIM process would require a die area of 310 μm by 1 mm. The resistor and capacitor in the prior art circuit therefore occupy a die area in an integrated circuit that is more than 20 times larger than the die area occupied by the capacitors in the peak detector example of FIG. 4.

Figure 5:
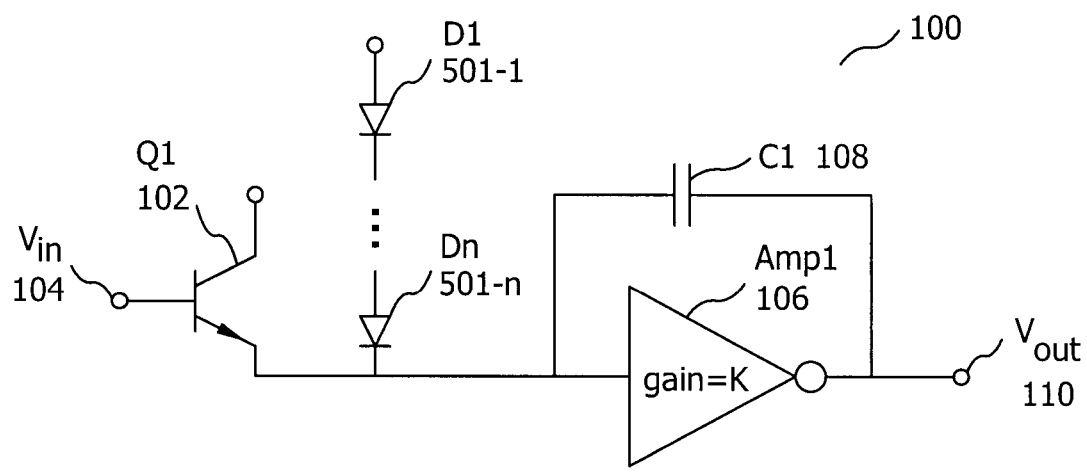
FIG. 5 is a schematic of a peak detector having one or more diodes to increase the off-resistance of the peak detector by reducing amplifier leakage current.

Leakage current flowing into the inputs of the amplifier Amp1 106 in FIG. 1 is drawn through transistor Q1 102, resulting in a decrease in off resistance of the transistor and correspondingly reducing a maximum value of time constant which may be implemented. Furthermore, amplifier leakage currents vary with changes in operating temperature and changes in process variables related to the manufacture of the integrated circuit in which the peak detector resides. Leakage current may be compensated for by adding diodes to the peak detector circuit, as in the example of FIG. 5. As shown in FIG. 5, one or more diodes D1 501-1 to Dn 501-n, are connected in series between a source of direct current (DC) power and an input to amplifier Amp1 106. Leakage current flowing into the amplifier Amp1 106 passes through the diodes instead of through transistor Q1 102. As a result, the effective off resistance Roff of the transistor Q1 102 is substantially increased and sensitivity of the peak detector 100 to process variations and temperature changes is significantly reduced.

Figure 6:
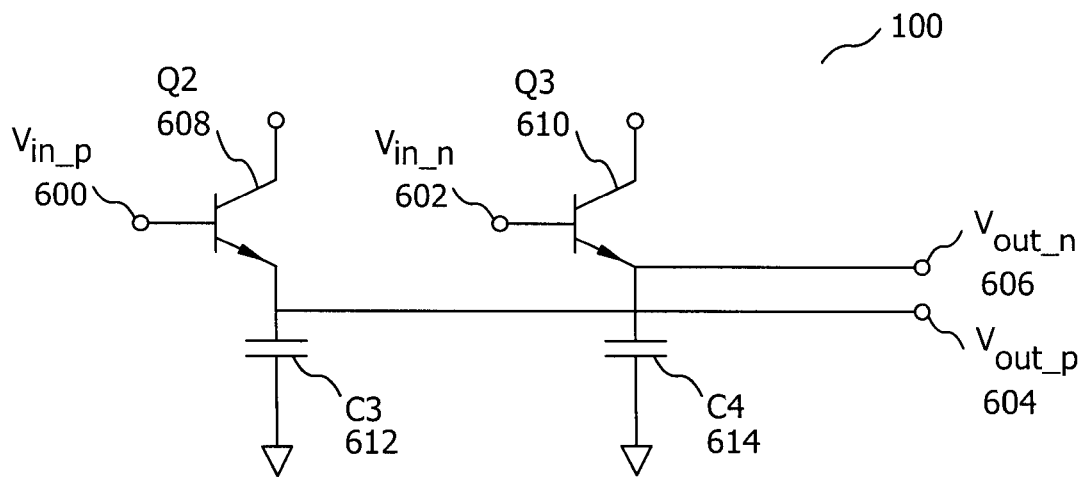
FIG. 6 is a schematic showing an example of a peak detector for differential signals.

The peak detectors 100 in FIGS. 1, 2, 4, and 5 are adapted for operation in single-ended circuits. Alternative embodiments of the invention are adapted for operation in differential circuits. For example, the peak detector 100 shown in FIG. 6 is a differential version of the peak detector example from FIG. 2. In FIG. 6, a positive input terminal Vin_p 600 is connected to the base of NPN transistor Q2 608. A negative input terminal Vin_n 602 is connected to the base of a second NPN transistor Q3 610. The collectors of transistors Q2 608 and Q3 610 are connected to a suitable source of DC power. The emitter of transistor Q2 608 is connected to a first terminal of capacitor C3 612, the second terminal of which is connected to a current return represented by a circuit ground symbol. The emitter of transistor Q3 610 is connected to a first terminal of capacitor C4 614, the second terminal of which is connected to a current return. Capacitors C3 612 and C4 614 optionally have a same value in order to implement a same value of time constant on both the positive and negative halves of the peak detector. A negative output terminal Vout_n 606 is connected to the emitter of transistor Q3 610, and a positive output terminal Vout_p 604 is connected to the emitter of transistor Q2 608. Input terminals Vin_p 600 and Vin_n 602 comprise a differential input pair, and output terminals Vout_p 604 and Vout_n 606 comprise a differential output pair.

Figure 7:
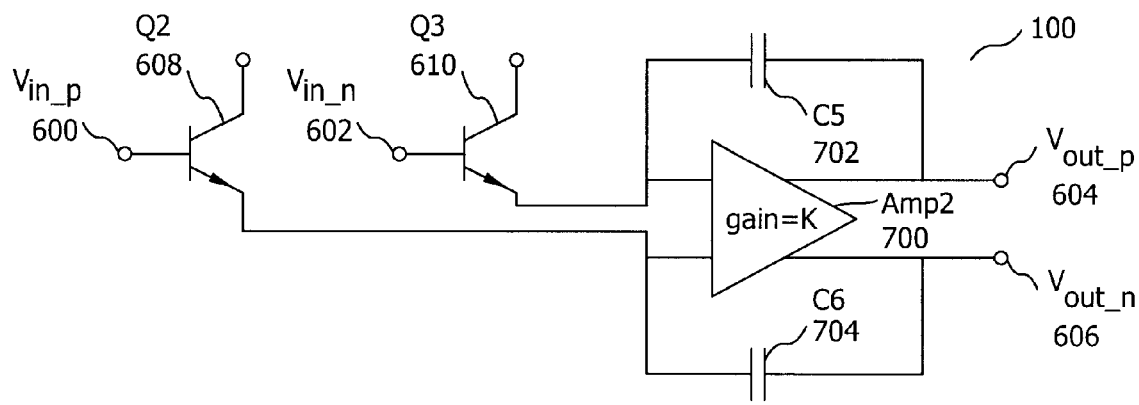
FIG. 7 is a schematic of an alternative embodiment of the invention for differential signals.

FIG. 7 shows an example of a differential peak detector related to the single-ended peak detector example 100 of FIG. 1. In the embodiment of the invention 100 of FIG. 7, the single-ended amplifier Amp1 106 of FIG. 1 is replaced by differential amplifier Amp2 700 which, like Amp1 106, has a gain of K. A positive input terminal Vin_p 600 is connected to the base of transistor Q2 608. A negative input terminal Vin_n is connected to the base of transistor Q3 610. The collector of Q2 608 and the collector of Q3 610 are connected to separate inputs of amplifier Amp2 700. A positive output terminal Vout_p 604 and a negative output terminal Vout_n 606 are connected to separate outputs of amplifier Amp2 700. A feedback loop capacitor C5 702 is connected between Vout_p 604, the emitter of transistor Q3 610, and an input to the amplifier. Another feedback loop capacitor C6 704 is connected between Vout_n 606, the emitter of transistor Q2 608, and another input to the amplifier. Terminals Vin_p 600 and Vin_n 602 form a differential input pair, and terminals Vout_p 604 and Vout_n 606 form a differential output pair. Capacitor C5 702 interacts with amplifier Amp2 700 to form a Miller capacitor having an effective capacitance of K×C5. Capacitor C6 and amplifier Amp2 700 similarly form another Miller capacitor having value K×C6. Capacitors C5 and C6 optionally have a same value to implement time constants of equal value on both sides of the differential peak detector 100.

Figure 8:
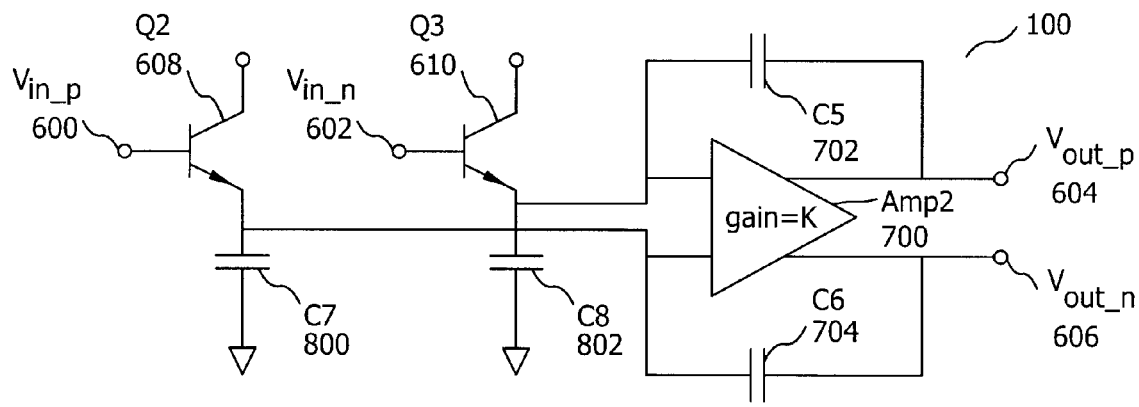
FIG. 8 is a schematic of a peak detector for differential signals having higher equivalent capacitance than the example of FIG. 7.

FIG. 8 shows another example of a differential peak detector. FIG. 8 is similar to FIG. 7, except that a bypass capacitor C7 800 is connected from the emitter of transistor Q2 608 to a current return, and another bypass capacitor C8 802 is connected from the emitter of transistor Q3 610 to a current return. The resulting effective value of capacitance at Vout_p 604 is C7+(K×C6). The effective value of capacitance at Vout_n 606 is C8+(K×C8) for an amplifier gain of K for Amp2 700.

Figure 9:
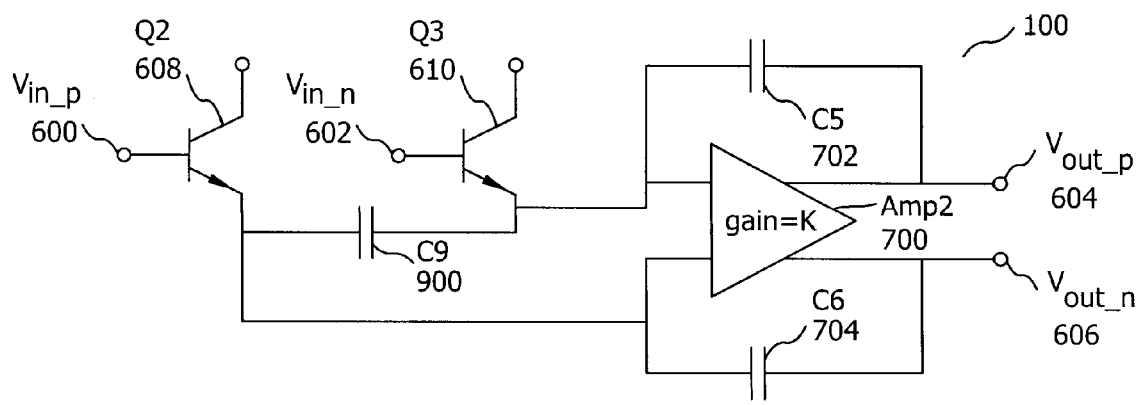
FIG. 9 is a schematic of alternative configuration for the peak detector of FIG. 8.

FIG. 9 illustrates another alternative embodiment of the invention for differential signals. FIG. 9 is similar to FIG. 8, except that C7 800 and C8 802 from FIG. 8 have been deleted in the example of FIG. 9, and an emitter-to-emitter capacitor C9 900 is connected in series between the emitter of Q2 608 and the emitter of Q3 610. The resulting effective value of capacitance at Vout_p 604 is (2×C9)+(K×C6). The resulting effective value of capacitance at Vout_n 606 is also (2×C9)+(K×C6).

Figure 10:
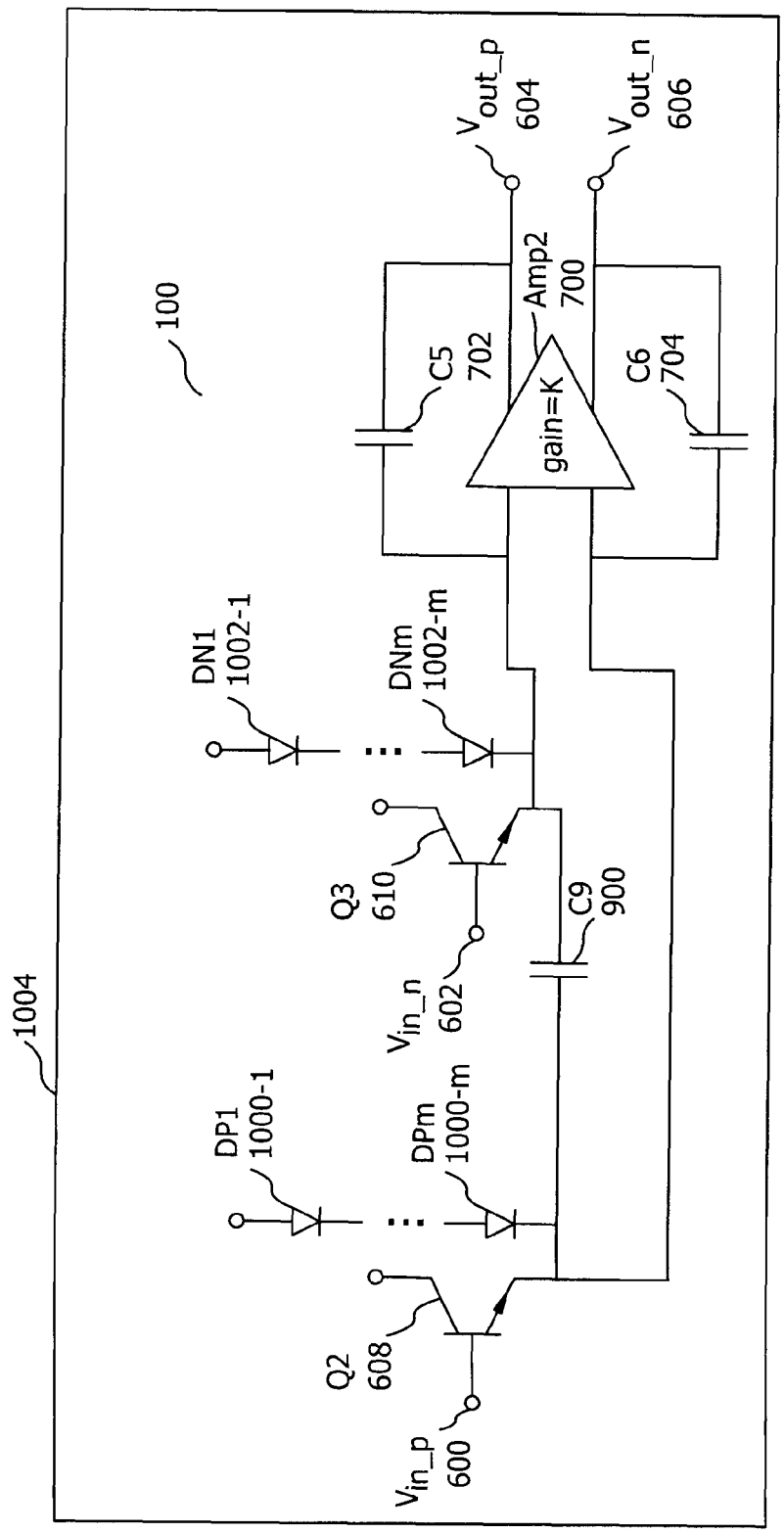
FIG. 10 is a schematic of an alternative to the embodiment of the invention of FIG. 9, in which one or more diodes are included for compensation of amplifier leakage current.

Peak detectors for differential circuits may optionally be compensated for amplifier leakage currents. FIG. 10 is a schematic diagram of a peak detector 100 for differential applications, compensated for amplifier leakage by the addition of two or more diodes. FIG. 10 is similar to FIG. 9, except that FIG. 10 adds one or more diodes DP1 1000-1 to DPm 1000-m connected in series between a DC power source and the emitter of transistor Q2 608, and one or more diodes DN1 1002-1 to DNm 1002-m in series between DC power and the emitter of transistor Q3 610. The diodes act to increase values for Roff in Q2 608 and Q3 610. The diodes also reduce the effects of variations in process parameters and variations in operating temperature, as previously described. FIG. 10 also shows a solid boundary representing an integrated circuit 1004 containing all of the components of the peak detector 100.

Figure 11:
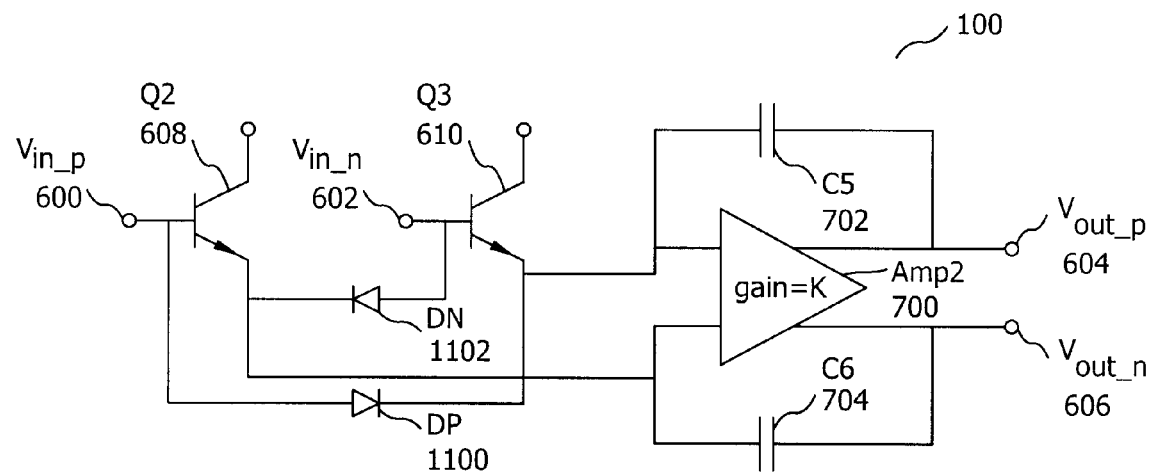
FIG. 11 is a schematic of an embodiment of the invention having an alternative arrangement of diodes for leakage current compensation.

FIG. 11 shows an embodiment of the invention with an alternative arrangement of diodes for compensation of amplifier leakage current. The example of FIG. 11 is similar to the example of FIG. 7, except that in FIG. 11, a first base-to-emitter diode DP 1100 is connected in series between positive input terminal Vin_p 600 and the emitter of transistor Q3 610. A second base-to-emitter diode DN 1102 is connected in series between negative input terminal Vin_n 602 and the emitter of transistor Q2 608. The peak detectors of FIGS. 6, 8, and 9 may optionally be compensated for amplifier leakage current with forward-biased diodes in a manner comparable to the example of FIG. 11.

Figure 12:
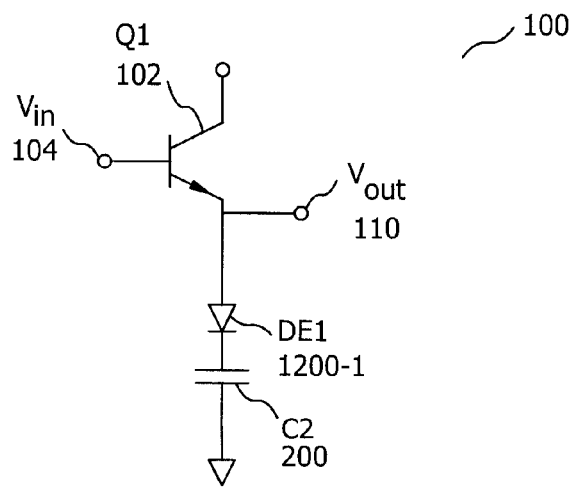
FIG. 12 is a schematic illustrating an alternative embodiment of the invention in which a diode connected to the transistor's emitter results in a substantial increase in the value of the peak detector's time constant.
Figure 13:
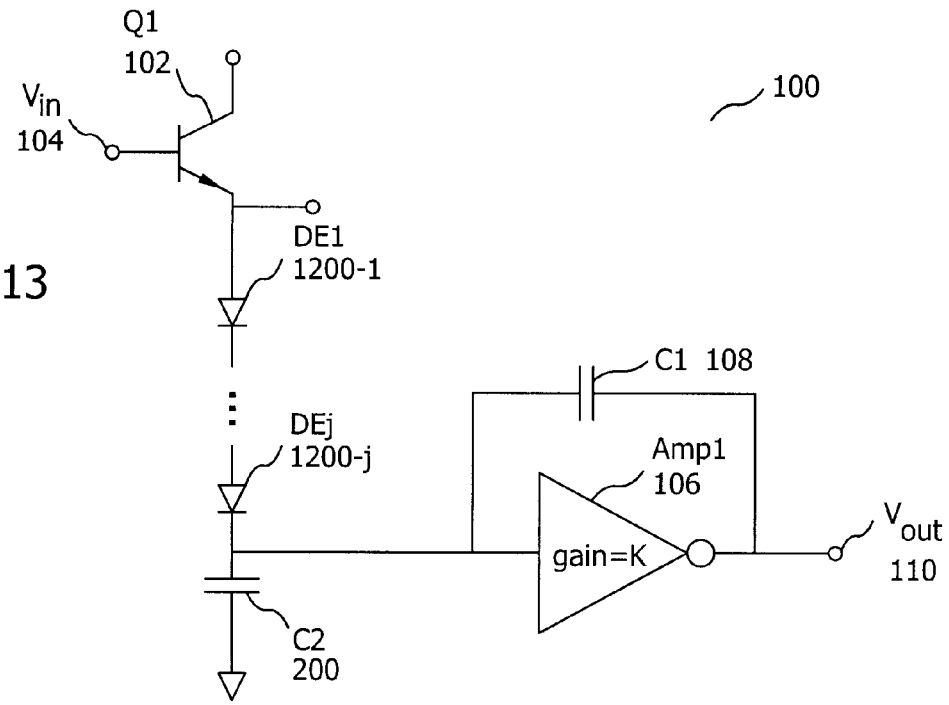
FIG. 13 is a schematic of an alternative to the peak detector of FIG. 12, further including a Miller capacitor and one or more optional diodes.

A time constant in any of the previous embodiments of the invention may be increased by connecting a diode to the emitter of one or more transistors in a peak detector. A diode DE1 1200-1 connected in series as in the example of FIG. 12 approximately doubles a maximum value for a time constant for the peak detector. More than one diode DE1 1200-1 to DEj 1200-j may optionally be connected in series, as in the example of FIG. 13. One or more diodes DE1 1200-1 to DEj 1200-j may optionally be connected as shown in FIG. 13 to the emitters of transistors in any of the previous examples.

Figure 14:
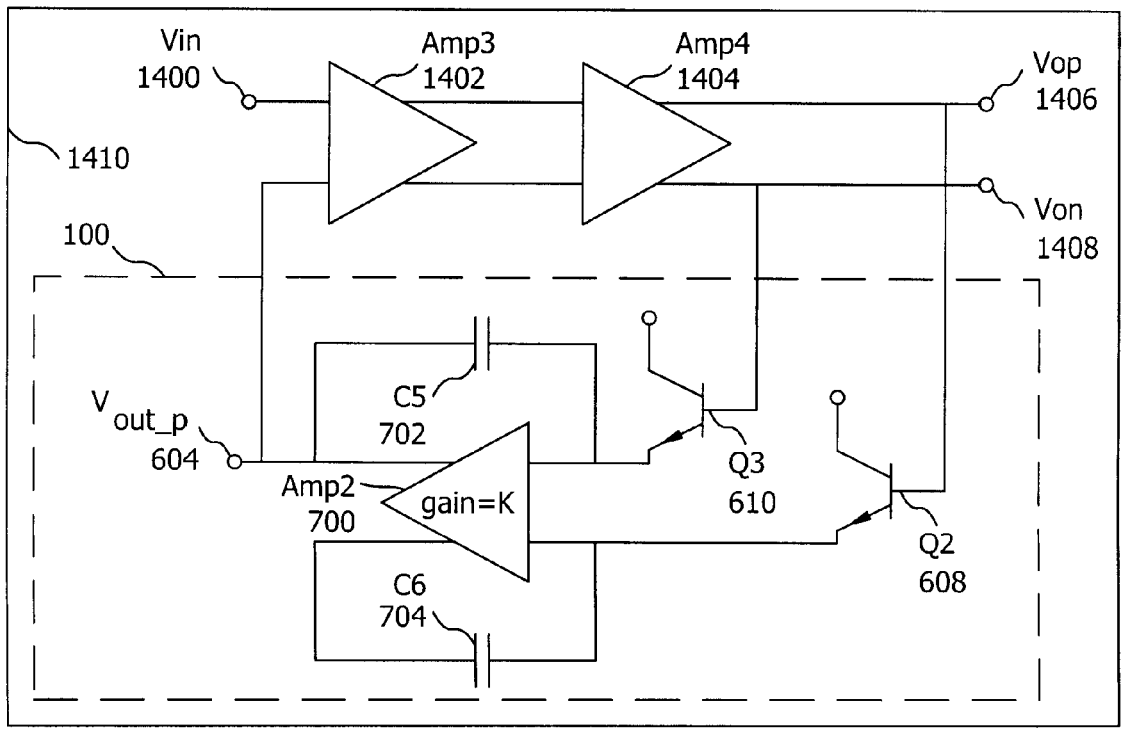
FIG. 14 is an example of an application for an embodiment of the invention in which a peak detector with Miller capacitors is part of a single-ended to differential converter circuit.

FIG. 14 may be used to illustrate several differences between a peak detector in accord with an embodiment of the invention and circuits for setting time constants known in the art. FIG. 14 represents a schematic of a single-ended to differential converter using a peak converter 100 for differential applications as previously described for the example of FIG. 7, although any of the peak detector examples of FIG. 6, 8, 9, 10, 11, 12, or 13 could also be used in the converter. As shown in FIG. 14, a single-ended signal is input on a terminal Vin 1400 to first input of a differential amplifier Amp3 1402. Differential outputs from Amp3 1402 are connected to differential inputs of Amp4 1404, and positive output terminal Vop 1406 and negative output terminal Von 1408 are connected to differential outputs of Amp4 1404. A peak detector 100 has a first input connection from negative output terminal Von 1408 to the base of transistor Q3 610. A second input connection is made between the positive output terminal Vop 1406 and the base of transistor Q2 608. An output Vout_p 604 from the peak detector 100 is connected to a second input to amplifier Amp3 1402. Amplifier Amp2 700 has a gain of K, as previously described for FIG. 7. A solid boundary line surrounding the components in the schematic shown in FIG. 14 is representative of an integrated circuit 1410 that contains all of the components in the peak detector 100 for setting a selected large value of time constant, and optionally contains all of the remaining components in the single-ended to differential converter.

Figure 15:
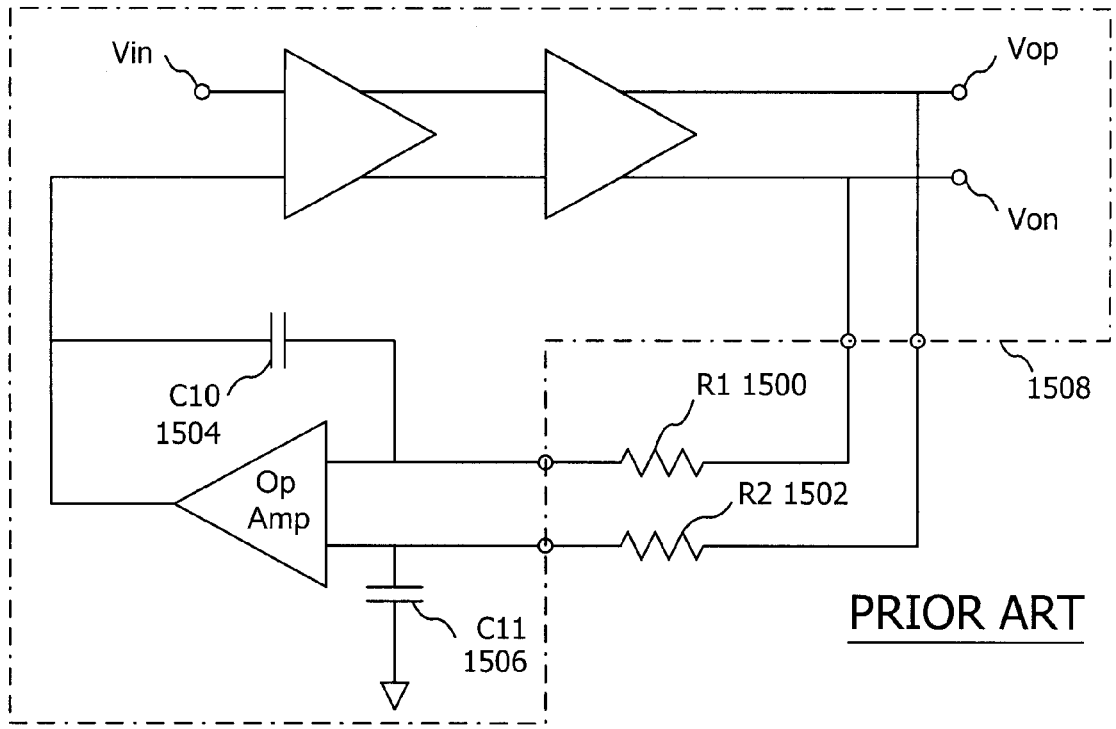
FIG. 15 is an example of a single-ended to differential converter known in the art, showing resistors and capacitors which may be located outside an integrated circuit in order to achieve a large time constant. (PRIOR ART).

In comparison to the single-ended to differential converter of FIG. 14, the prior-art converter of FIG. 15 uses resistors R1 1500 and R2 1502 in combination with capacitors C10 1504 and C11 1506 to set a time constant value. The larger the desired value for a time constant, corresponding to a value for a low-frequency cutoff for the converter, the larger the values of resistors R1 1500 and R2 1502 that are needed. For many applications, R1 and R2 will need values of about a megohm. However, as previously explained, such large resistors may be impractical or uneconomical to implement in an integrated circuit. For large time constants, therefore, resistors R1 1500 and R2 1502 are located externally to an integrated circuit containing the converter's amplifiers. Capacitors C10 1504 and C11 1506 may similarly need to be located outside the integrated circuit, for selected values of capacitance too large for implementation in the integrated circuit. A prior-art integrated circuit 1508 containing some of the components of the single-ended to differential converter of FIG. 15 is represented by a dot-dash boundary line. Note that resistors R1 1500 and R2 1502 are not included in the prior-art integrated circuit 1508 of FIG. 15.

Figure 16:
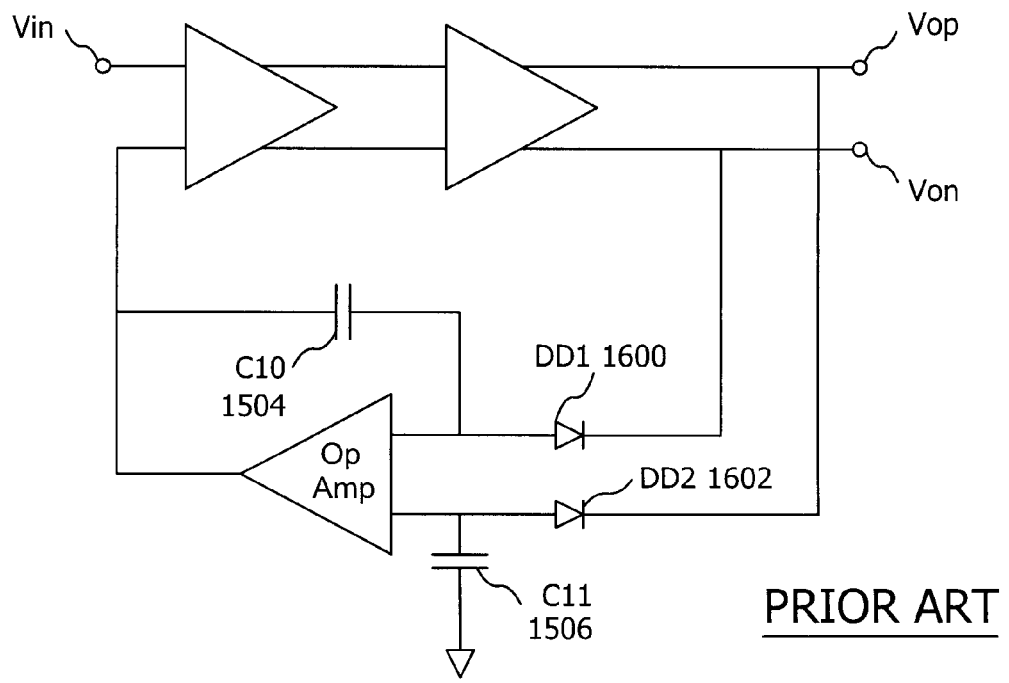
FIG. 16 is an example of a single-ended to differential converter known in the art, showing reverse-biased diodes having equivalent resistance which may vary substantially as a result of changes in process variables or changes in temperature. (PRIOR ART).

In some prior-art circuits, resistors R1 1500 and R2 1502 from FIG. 15 are replaced with diodes, as shown in FIG. 16. Diodes DD1 1600 and DD2 1602 have the advantage of providing a relatively high equivalent resistance in a relatively small amount of integrated circuit die area. However, because diodes DD1 1600 and DD2 1602 are reverse-biased, their equivalent resistance is subject to substantial variation from variations in manufacturing process parameters and from variations in operating temperatures. In contrast, the embodiments of the invention described herein do not use reverse-biased diodes and are therefore less susceptible to process variations and temperature variations than circuits known in the art for setting time constants with large values.

Although the examples of a peak detector described herein are shown with bipolar NPN transistors, for example heterojunction bipolar transistors, alternative embodiments of the invention may be made with other types of transistors used in integrated circuits, for example transistors manufactured in processes such as, but not limited to CMOS, BiCMOS, SiGe, and GaAS processes.

Unless expressly stated otherwise herein, ordinary terms have their corresponding ordinary meanings within the respective contexts of their presentations, and ordinary terms of art have their corresponding regular meanings.

What is claimed is:

1. A peak detector in an integrated circuit comprising:
   a large value for an RC time constant;
   a first transistor;
   a Miller capacitor electrically connected to said first transistor, comprising:
      an amplifier having a first input and a first output; and
      a first feedback loop capacitor electrically connected to said first amplifier output, said first amplifier input, and said first transistor; and
   a first bypass capacitor electrically connected to said first transistor and said first amplifier input,
   wherein said value for an RC time constant is determined by said first transistor and said Miller capacitor.

2. The peak detector in an integrated circuit of claim 1, further comprising a forward biased diode electrically connected to said first transistor and said first amplifier input.

3. The peak detector in an integrated circuit of claim 2, further comprising a plurality of said forward-biased diodes electrically connected in series.

4. The peak detector in an integrated circuit of claim 1, further comprising a forward-biased diode electrically connected from said first transistor to said first amplifier input.

5. The peak detector in an integrated circuit of claim 4, further comprising a plurality of said forward-biased diodes electrically connected in series from said first transistor to said first amplifier input.

6. The peak detector in an integrated circuit of claim 1, further comprising:
   a second transistor;
   said amplifier further comprising a second input and a second output; and
   a second feed back loop capacitor electrically connected to said second amplifier output, said second amplifier input; and said second transistor.

7. The peak detector in an integrated circuit of claim 6, further comprising an emitter-to-emitter capacitor electrically connected to said first transistor and said second transistor.

8. The peak detector in an integrated circuit of claim 7, further comprising:
   a first forward-biased diode electrically connected from a source of DC power to said first transistor and said emitter-to-emitter capacitor; and
   a second forward-biased diode electrically connected from a source of DC power to said second transistor, said emitter-to-emitter capacitor, and said first amplifier input.

9. The peak detector in an integrated circuit of claim 8, further comprising a plurality of said first forward-biased diode electrically connected in series.

10. The peak detector in an integrated circuit of claim 9, further comprising a plurality of said second forward-biased diode electrically connected in series.

11. The peak detector in an integrated circuit of claim 6, comprising:
   said first transistor further comprising a base and an emitter;
   said second transistor further comprising a base and an emitter; and
   a first base-to-emitter diode having an anode and a cathode;
   wherein said anode of first base-to-emitter diode is electrically connected to said base of said first transistor and said cathode of said first base-to-emitter diode is electrically connected to said emitter of said second transistor.

12. The peak detector in an integrated circuit of claim 6, comprising a second base-to-emitter diode having an anode and a cathode, wherein said anode of said second base-to-emitter diode is electrically connected to said base of said second transistor and said cathode of said second base-to-emitter diode is electrically connected to said emitter of said first transistor.

* * * * *